United States Patent
Lukanc et al.

(10) Patent No.: US 6,753,266 B1
(45) Date of Patent: Jun. 22, 2004

(54) METHOD OF ENHANCING GATE PATTERNING PROPERTIES WITH REFLECTIVE HARD MASK

(75) Inventors: Todd P. Lukanc, San Jose, CA (US); Scott A. Bell, San Jose, CA (US); Christopher F. Lyons, Fremont, CA (US); Marina V. Plat, San Jose, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/845,654

(22) Filed: Apr. 30, 2001

(51) Int. Cl.$^7$ .................. H01L 21/309; H01L 21/461
(52) U.S. Cl. .................. 438/739; 438/738; 438/740; 438/742; 438/717; 438/719; 438/585; 438/720
(58) Field of Search .................. 438/738, 739, 438/740, 742, 717, 719, 585, 720, FOR 405, 752, 636, 695, 697, 708; 216/72, 74, 95, 100

(56) References Cited

U.S. PATENT DOCUMENTS

| | | | | |
|---|---|---|---|---|
| 4,460,435 A | * | 7/1984 | Maa | 438/647 |
| 5,264,076 A | | 11/1993 | Cuthbert et al. | 438/751 |
| 5,346,587 A | * | 9/1994 | Doan et al. | 438/585 |
| 5,773,199 A | | 6/1998 | Linliu et al. | 430/316 |
| 5,804,088 A | * | 9/1998 | McKee | 216/47 |
| 5,837,428 A | | 11/1998 | Huang et al. | 430/313 |
| 5,858,621 A | | 1/1999 | Yu et al. | 430/313 |
| 5,883,011 A | * | 3/1999 | Lin et al. | 438/747 |
| 6,080,678 A | | 6/2000 | Yim | 438/725 |
| 6,096,659 A | | 8/2000 | Gardner et al. | 438/736 |
| 6,136,679 A | | 10/2000 | Yu et al. | 438/592 |
| 6,156,485 A | * | 12/2000 | Tang et al. | 430/313 |
| 6,156,629 A | | 12/2000 | Tao et al. | 438/535 |

* cited by examiner

*Primary Examiner*—George Fourson
*Assistant Examiner*—Julio J. Maldonado
(74) *Attorney, Agent, or Firm*—Foley & Lardner

(57) ABSTRACT

An exemplary method of fabricating an integrated circuit can include depositing a reflective metal material layer over a layer of polysilicon, depositing an anti-reflective coating over the reflective metal material layer, trim etching the anti-reflective coating to form a pattern, etching the reflective metal material layer according to the pattern, and removing portions of the polysilicon layer using the pattern formed from the removed portions of anti-reflective coating.

19 Claims, 2 Drawing Sheets

METHOD OF ENHANCING GATE PATTERNING PROPERTIES WITH REFLECTIVE HARD MASK

CROSS REFERENCE TO RELATED APPLICATIONS

This application is related to U.S. patent application Ser. No. 09/845,656, entitled USE OF SILICON CONTAINING IMAGING LAYER TO DEFINE SUB-RESOLUTION GATE STRUCTURES, and U.S. patent application Ser. No. 09/845,649, entitled BI-LAYER TRIM ETCH PROCESS TO FORM INTEGRATED CIRCUIT GATE STRUCTURES, both of which are assigned to the same assignee as this application and are filed on an even day herewith.

FIELD OF THE INVENTION

The present specification relates generally to integrated circuits and methods of manufacturing integrated circuits. More particularly, the present specification relates to enhancing gate patterning properties with reflective hard mask.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of IC devices on an IC, there is still a need to decrease the size of IC device features, and, thus, increase the number of devices on an IC.

One limitation to achieving smaller sizes of IC device features is the capability of conventional lithography. Lithography is the process by which a pattern or image is transferred from one medium to another. Conventional IC lithography uses ultra-violet (UV) sensitive photoresist. Ultra-violet light is projected to the photoresist through a reticle or mask to create device patterns on an IC. Conventional IC lithographic processes are limited in their ability to print small features, such as contacts, trenches, polysilicon lines or gate structures.

Generally, conventional lithographic processes (e.g., projection lithography and EUV lithography) do not have sufficient resolution and accuracy to consistently fabricate small features of minimum size. Resolution can be adversely impacted by a number of phenomena including: diffraction of light, lens aberrations, mechanical stability, contamination, optical properties of resist material, resist contrast, resist swelling, thermal flow of resist, etc. As such, the critical dimensions of contacts, trenches, gates, and, thus, IC devices, are limited in how small they can be.

Another difficulty arising from the continuing small dimensions involved in the creation of gate structures is the tendency in the lithography process to experience resist erosion and pattern collapse during trim etch processes. During trim etch processes, a significant amount of the resist is normally etched away in a vertical direction, resulting in a substantial weakening and thinning of the photoresist. This significant reduction of the vertical dimension or thickness of the photoresist from its untrimmed vertical dimension can promote discontinuity thereof, resulting in the photoresist being incapable of providing effective masking in the fabrication of the gate. The resist thickness erosion occurs during etch processes. Exemplary trim processes are described in U.S. Pat. No. 5,965,461 entitled CONTROLLED LINEWIDTH REDUCTION DURING GATE PATTERN FORMATION USING A SPIN-ON BARC.

Thus, there is a need to optimize gate patterning and generate a hard mask to control gate final sizes. Further, there is a need for a method of enhancing gate patterning properties with reflective hard mask. Yet further, there is a need to use imaging layers to define gate structures having small critical dimensions.

SUMMARY OF THE INVENTION

An exemplary embodiment is related to a method of fabricating an integrated circuit. This method can include depositing a reflective metal material layer over a layer of a polysilicon, depositing an anti-reflective coating over the reflective metal material layer, trim etching the anti-reflective coating to form a pattern, etching the reflective metal material layer according to the pattern, and removing portions of the polysilicon layer using the pattern formed from the removed portions of anti-reflective coating.

Another exemplary embodiment is related to a method of optimizing optical properties of gate patterning to control gate size in an integrated circuit fabrication process. The method can include providing a reflective metal layer over a gate material layer, providing a mask layer over the reflective metal layer, and patterning the gate material layer including selectively etching the mask layer and the reflective metal layer.

Another exemplary embodiment is related to a method of forming a gate in an integrated circuit. This method can include providing a gate material layer, providing a reflective metal layer over the gate material layer, providing an anti-reflective coating (ARC) layer over the reflective metal layer, providing a resist layer over the ARC layer, and patterning a gate structure in the gate material layer by selectively removing portions of the resist layer, ARC layer, and gate material layer.

Other principle features and advantages of the invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE EXEMPLARY EMBODIMENTS

Figure 1:
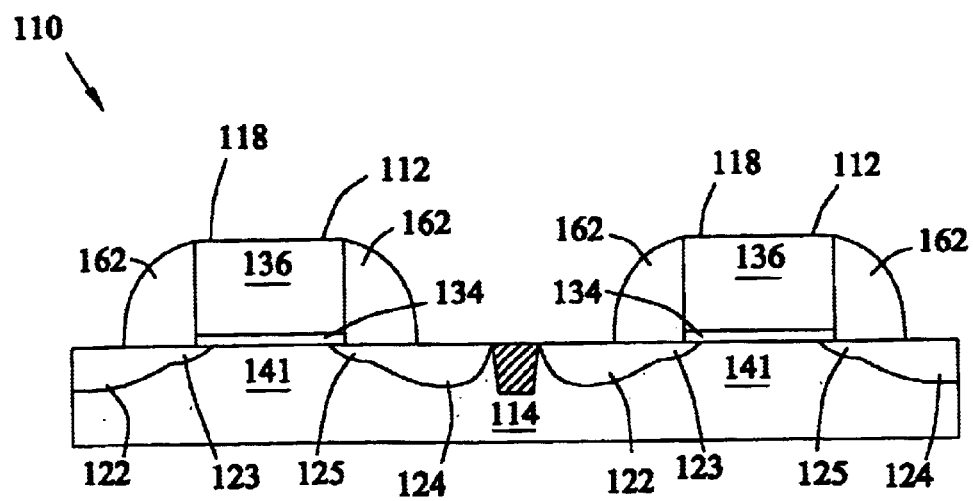
FIG. 1 is a schematic cross-sectional view representation of a portion of an integrated circuit fabricated in accordance with an exemplary embodiment.

With reference to FIG. 1, a portion 110 of an integrated circuit (IC) includes a transistor 112 which is disposed on a semiconductor substrate 114, such as, a wafer. Semiconductor substrate 114 is preferably a bulk P-type single crystalline (001) silicon substrate. Alternatively, substrate 114 can be an N-type well in a P-type substrate, an insulative substrate, a semiconductor-on-insulator (SOI) substrate, (preferably silicon-on-glass) or other suitable material for transistor 112.

Transistor 112 can be a P-channel or N-channel metal oxide semiconductor field effect transistor (MOSFET). Transistor 112 is preferably embodied as a MOSFET and includes a gate structure 118, a source region 122, and a drain region 124. Gate structure 118 advantageously includes single crystalline material that reduces variability in gate lengths due to grain structure. In one embodiment, gate structure 118 has a gate length between source region 122 and drain region 124 in the nanometer scale.

For an N-channel transistor, regions 122 and 124 are heavily doped with N-type dopants (e.g., $5 \times 10^{19}$–$1 \times 10^{20}$ dopants per cubic centimeter). For a P-channel transistor, regions 122 and 124 are heavily doped with P-type dopants ($5 \times 10^{19}$–$1 \times 10^{20}$ dopants per cubic centimeter). An appropriate dopant for a P-channel transistor is boron, boron diflouride, or iridium, and an appropriate dopant for an N-type transistor is arsenic, phosphorous, or antimony.

Source and drain regions 122 and 124 can be provided with extensions 123 and 125. Preferably, ultra-shallow extensions 123 and 125 (e.g., junction depth is less than 20 nanometers (nm), 100–250 Å) are integral with regions 122 and 124. Source and drain extensions 123 and 125 can be disposed partially underneath gate structure 118.

A channel region 141 underneath gate structure 118 separates regions 122 and 124. Region 141 can be doped according to device parameters. For example, region 141 can be doped according to a super steep retrograded well region.

Gate stack or structure 118 includes a gate conductor 136 and a gate dielectric layer 134. Alternatively, structure 118 can include three or more conductive or semiconductive layers.

Gate conductor 136 is preferably a polysilicon material. Gate conductor 136 has a thickness of 800–1600 Å and a width of less than 50 nm (e.g., channel length). Conductor 136 can have a width that is less than the width achievable by conventional lithography.

Gate conductor 136 can be a semiconductor material implanted with dopants, with other semiconductor materials or can be an in situ doped material. Gate conductor 136 is also preferably heavily doped with an N-type dopant, such as phosphorous (P), arsenic (As) or other dopant. Alternatively, gate conductor 136 can be doped with a P-type dopant, such a boron (B), boron diflouride ($BF_2$), or other dopant.

Dielectric layer 134 is preferably a 15 to 25 Å thick thermally grown silicon dioxide layer. Alternatively, layer 134 can be a silicon nitride layer. Dielectric layer 134 can be comprised of a high-k dielectric material such as a 2–10 nm thick conformal layer of tantalum pentaoxide ($Ta_2O_5$), aluminum oxide ($Al_2O_3$), titanium dioxide ($TiO_2$) or other material having a dielectric constant (k) over 8.

A silicide layer can be disposed above source region 122, drain region 124, and conductor 136. Preferably, a nickel silicide ($WSi_x$) is utilized. Alternatively, the silicide layer can be any type of refractory metal and silicon combination, such as, a cobalt silicide, tungsten silicide, titanium silicide, or other silicide material.

Transistor 112 can be an N-channel or a P-channel field effect transistor, such as, a metal oxide semiconductor field effect transistor (MOSFET). Transistor 112 is at least partially covered by insulative layer 148 and is preferably part of an ultra-large scale integrated (ULSI) circuit that includes one million or more transistors.

Spacers 162 are preferably silicon nitride spacers and have a height of 800–1600 Å and a width of 400–600 Å. Spacers 162 abut side walls of conductor 136 and layer 134.

With reference to FIGS. 1–4, the fabrication of transistor 112, including gate conductor 136 is described as follows. The advantageous process allows gate structure to have a small critical dimension, such as, width. The width of conductor 136 can be related to the gate length of transistor 112. Further, the process described with respect to FIGS. 1–4 optimizes gate patterning and generates a hard mask to control gate final size.

Figure 2:
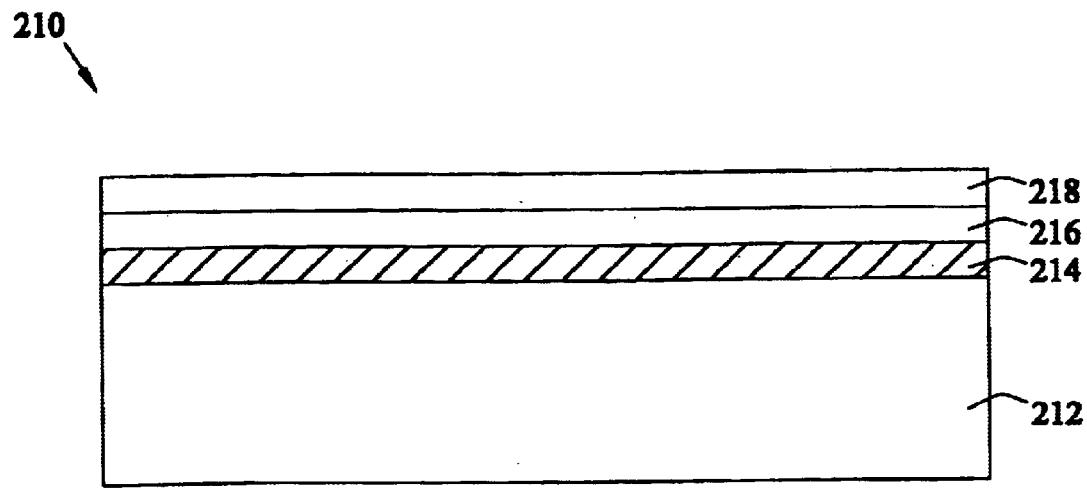
FIG. 2 is a schematic cross-sectional view representation of a portion of the integrated circuit illustrated in FIG. 1, showing a deposition step.

Referring to FIG. 2, a schematic cross-sectional view representation of a portion 210 of an integrated circuit (IC) includes a polysilicon layer 212, a reflective metal layer 214, an anti-reflective coating (ARC) layer 216, and a resist layer 218. Portion 210 is preferably part of an ultra-large-scale integrated (ULSI) circuit having millions of more transistors. Portion 210 is manufactured as part of the IC on a semiconductor wafer, such as, a silicon wafer.

Polysilicon layer 212 can be any of a variety of materials which can serve as a portion of a gate structure 118 (FIG. 1). In an exemplary embodiment, polysilicon layer has a thickness between 500 and 2500 Angstroms (preferably, 1,000 Angstroms, for example). Alternatively, layer 212 can be other materials suitable for gate conductor 136. Layer 212 can be a refractory metal or a single crystalline material. Layer 212 can be in-situ doped or doped subsequently. In one embodiment, layer 212 is an 800–1600 Angstroms polycrystalline layer deposited by chemical vapor deposition (CVD) or a 800–1600 Angstrom aluminum layer deposited by sputter deposition.

Reflective metal layer 214 can be tungsten (W) or any other reflective metal. ARC layer 216 can be SiN, SiON, SiRN, or any other suitable material having appropriate anti-reflective properties. ARC layer 216 is located above reflective metal layer 214 and polysilicon layer 212. In an exemplary embodiment, ARC layer 216 has a thickness of 400–800 Angstroms and reflective metal layer 214 has a thickness of 80–200 Angstroms.

In an exemplary embodiment, reflective metal layer 214 is deposited on polysilicon layer 212. ARC layer 216 is deposited over reflective metal layer 214. Resist layer 218 is then provided over ARC layer 216. In an exemplary embodiment, reflective metal layer 214 is deposited using a chemical vapor deposition (CVD) application of a thin tungsten material. In an exemplary embodiment, reflective metal layer 214 containing tungsten has a thickness of 80–200 Angstroms. ARC layer 216 is deposited in a CVD or spin-on process. Resist layer 218 can be applied by a spin coating process.

Patterning of ARC layer 216 can be done using a variety of techniques, such as, photolithography or e-beam lithography. Such patterns can be transferred from resist layer 218. In an exemplary embodiment, resist layer 218 is patterned via radiation and developed. Then, ARC layer 216 is etched in accordance with resist layer 218 and resist layer 218 is removed.

Figure 3:
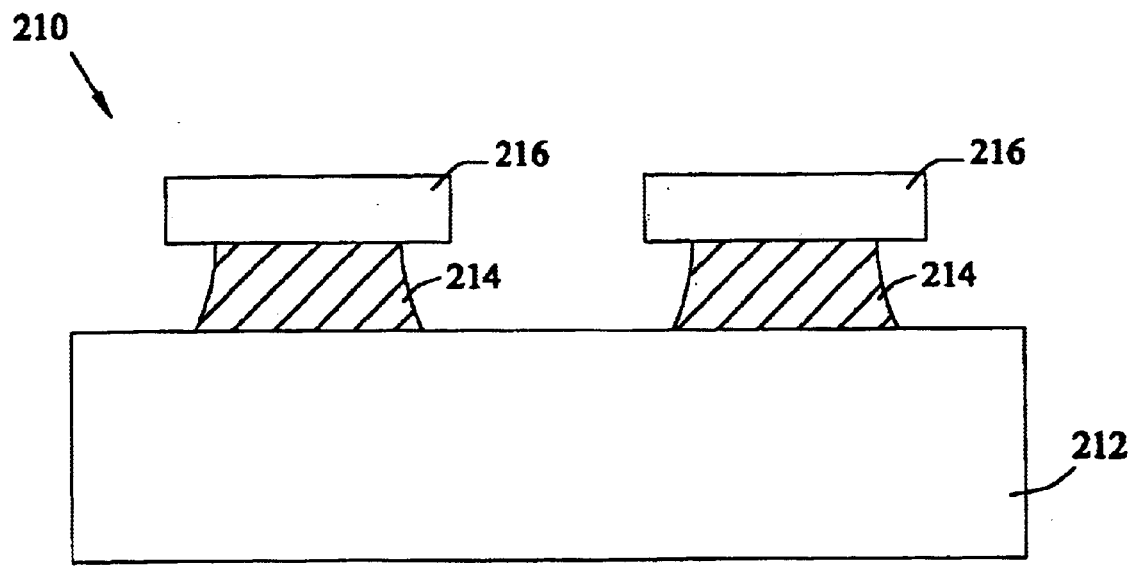
FIG. 3 is a schematic cross-sectional view representation of a portion of the integrated circuit illustrated in FIG. 2, showing an etching step.

After layer 216 is patterned from resist layer 218, portion 210 is exposed and developed. Referring now to FIG. 3, an isotropic etch is applied to remove portions of reflective metal layer 214. In an exemplary embodiment, a trim etch technique is employed to undercut ARC layer 216. As such, reflective metal layer 214 has a pattern with smaller widths than ARC layer 216. During the underlayer etch, ARC layer 216 is stripped. Advantageously, the pattern created includes widths which are less than one lithographic feature. ARC layer 216 is stripped using an etching process or, alternatively, a hydrofluoric acid (HF) dip. The etching process can be a wet or dry etch consistent with industry practice. This etch results in a rounded shape to remaining portions of reflective metal layer 214, as shown in FIG. 4.

Figure 4:
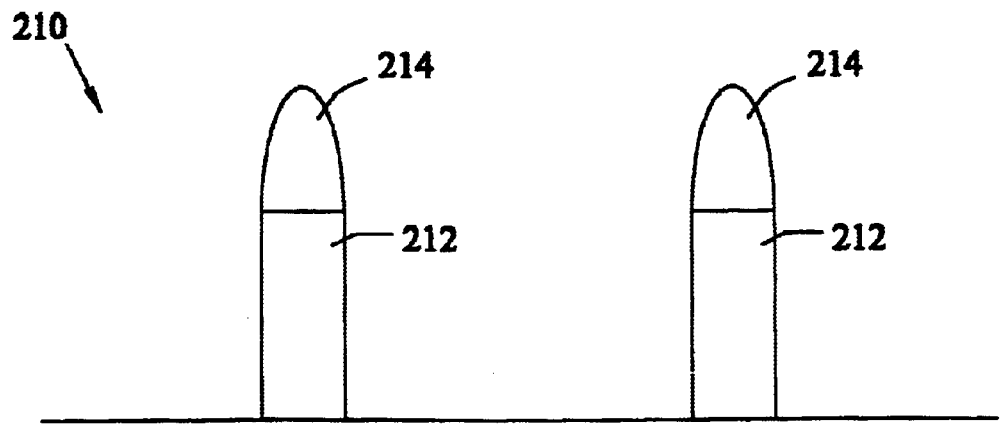
FIG. 4 is a perspective cross-sectional view representation of a portion of the integrated circuit illustrated in FIG. 3, showing a gate structure formation step.

Referring now to FIG. 4, polysilicon layer 212 is selectively etched using remaining portions of reflective metal layer 214 as a hard mask pattern. Remaining portions of polysilicon layer 212 can serve as gate structures 232. Advantageously, gate structures 232 have a width or critical dimension which are not limited by the lithography processes but other fabrication limitations. Gate structures 232 correspond to gate structure 118 described with reference to FIG. 1.

Referring again to FIG. 1, source and drain regions 122 and 124 are formed in substrate 114, extensions 123 and 125 are formed, a silicide layer is deposited, and spacers 162 are provided. In another exemplary embodiment, additional features are formed during the integrated circuit fabrication process.

Advantageously, deposition of a thin reflective metal, such as, tungsten (W) followed by an anti-reflective coating (ARC), such as, SiON and then resist optimizes optical properties of gate patterning. Reflective metal layer 214 is optically opaque to polysilicon layer 216. As such, the thickness of polysilicon layer 216 is unaffected by the use of reflective metal layer 214. In contrast, an anti-reflective coating (ARC) used alone must be matched to the polysilicon or gate layer material.

Gate stack or structure 118 can be patterned using SiON layer 210 and reflective metal layer 214. In an exemplary embodiment, metal layer 214 has very good selectivity to polyetch. As such, metal layer 214 holds up well even though a large trim of ARC layer 216 reduces the thickness of metal layer 214. However, metal layer 214 only needs to be a few 100 Angstroms to withstand the etch. Advantageously, due to etch chemistry differences in films, good selectivity can be achieved between the ARC layer, reflective metal layer, and the polysilicon gate layer.

While the exemplary embodiments illustrated in the figures and described above are presently preferred, it should be understood that these embodiments are offered by way of example only. Other embodiments may include, for example, different methods of patterning or etching various layers as well as different methods of application of ARC layer 216. The invention is not limited to a particular embodiment, but extends to various modifications, combinations, and permutations that nevertheless fall within the scope and spirit of the appended claims.

What is claimed is:

1. A method of fabricating an integrated circuit, the method comprising:
   depositing a reflective metal material layer over a layer of polysilicon;
   depositing an anti-reflective coating over the reflective metal material layer;
   etching the anti-reflective coating;
   trim etching the reflective metal material layer to form a mask pattern, wherein the anti-reflective coating is removed during the trim etching; and
   removing portions of the polysilicon layer using the formed mask pattern, wherein a remaining portion of the polysilicon layer is a gate structure.

2. The method of claim 1, further comprising depositing a resist layer over the anti-reflective coating.

3. The method of claim 1, wherein the step of removing portions of the anti-reflective coating comprises providing an isotropic etch to the anti-reflective coating.

4. The method of claim 1, wherein the reflective metal material layer comprises tungsten.

5. The method of claim 4, wherein the reflective metal material layer has a thickness of 80–200 Angstroms.

6. A method of optimizing optical properties of gate patterning to control gate size in an integrated circuit fabrication process, the method comprising:
   providing a reflective metal layer over a gate material layer;
   providing a mask layer over the reflective metal layer; and
   patterning the gate material layer including selectively etching the mask layer, trim etching the reflective metal layer, and removing portions of the gate material layer using the trim etched reflective metal layer as a hardmask, wherein the mask layer is stripped during the trim etching of the reflective metal layer.

7. The method of claim 6, wherein the reflective metal layer comprises tungsten (W).

8. The method of claim 6, wherein the patterning step comprises trim etching the mask layer.

9. The method of claim 6, wherein the reflective metal layer has a thickness of 80–200 Angstroms.

10. The method of claim 6, wherein the step of providing a mask layer comprises depositing a layer of SiON and a layer of resist.

11. The method of claim 6, wherein the reflective metal layer is optically opaque to the gate material layer.

12. The method of claim 6, wherein the step of providing a reflective metal layer comprises selecting the reflective metal layer based on etch chemistry of the reflective metal layer and the gate material layer.

13. A method of forming a gate in an integrated circuit, the method comprising:
   providing a gate material layer;
   providing a reflective metal layer over the gate material layer;
   providing an anti-reflective coating (ARC) layer over the reflective metal layer;
   providing a resist layer over the ARC layer; and
   patterning a gate structure in the gate material layer by selectively removing portions of the resist layer, ARC layer, reflective layer, and gate material layer, wherein the ARC layer and portions of the reflective layer are removed using trim etching and remaining portions of the reflective layer are used as a mask to pattern the gate material layer.

14. The method of claim 13, wherein the reflective metal layer comprises tungsten (W).

15. The method of claim 13, wherein the metal material layer has a thickness of approximately 100 Angstroms.

16. The method of claim 13, wherein the ARC layer comprises SiON.

17. The method of claim 13, wherein the step of selectively removing comprises trim etching the ARC layer.

18. The method of claim 17, wherein the ARC layer is SiON.

19. The method of claim 18, wherein the reflective metal layer has a thickness of between 80 and 200 Angstroms.

* * * * *